United States Patent
Wu

(10) Patent No.: US 11,094,911 B2
(45) Date of Patent: Aug. 17, 2021

(54) ORGANIC LIGHT EMITTING DIODE DISPLAY PANEL AND PACKAGING METHOD THEREOF

(71) Applicant: Wuhan China Star Optoelectronics Technology Co., Ltd., Wuhan (CN)

(72) Inventor: Yeqing Wu, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 404 days.

(21) Appl. No.: 16/309,450

(22) PCT Filed: Sep. 12, 2018

(86) PCT No.: PCT/CN2018/105335
§ 371 (c)(1),
(2) Date: Dec. 12, 2018

(87) PCT Pub. No.: WO2019/200823
PCT Pub. Date: Oct. 24, 2019

(65) Prior Publication Data
US 2021/0098736 A1    Apr. 1, 2021

(30) Foreign Application Priority Data
Apr. 19, 2018    (CN) .......................... 201810356584.4

(51) Int. Cl.
*H01L 51/52*        (2006.01)
*H01L 27/32*        (2006.01)
(Continued)

(52) U.S. Cl.
CPC .......... *H01L 51/5246* (2013.01); *H01L 23/26* (2013.01); *H01L 23/564* (2013.01);
(Continued)

(58) Field of Classification Search
CPC . H01L 51/5259; H01L 51/5246; H01L 23/26; H01L 23/564
See application file for complete search history.

(56) References Cited

U.S. PATENT DOCUMENTS 6,081,071 A * 6/2000 Rogers ................... H05B 33/04
                                                                        313/512
6,833,668 B1 * 12/2004 Yamada .............. H01L 51/5246
                                                                        313/505
(Continued)

FOREIGN PATENT DOCUMENTS

CN        104167490 A    11/2014
CN        104538566 A     4/2015
(Continued)

OTHER PUBLICATIONS

Machine translation, Kijima, Japanese Pat. Pub. No. JP 2002-270366, translation date: Mar. 17, 2021, Espacenet, all pages. (Year: 2021).*

(Continued)

*Primary Examiner* — Victoria K. Hall
(74) *Attorney, Agent, or Firm* — Leong C. Lei

(57) ABSTRACT

Provided are an organic light emitting diode display panel and packaging method thereof. The organic light emitting diode display panel is provided with an adhesive layer on a passivation layer corresponding to a position of a sealant. When packaging the organic light emitting diode, the sealant on a cover plate is adhered corresponding to a position of the adhesive layer. The adhesive layer has a good bonding force with the sealant and also has a good bonding force with the passivation layer. Thus, water vapor does not easily enter the organic light emitting diode element, which will not reduce the performance of the organic light emitting diode element (Continued)

to improve a service life of organic light emitting diode element and to possess a good reliability performance.

8 Claims, 3 Drawing Sheets

(51) Int. Cl.
*H01L 51/56* (2006.01)
*H01L 23/26* (2006.01)
*H01L 23/00* (2006.01)

(52) U.S. Cl.
CPC ...... *H01L 27/3258* (2013.01); *H01L 51/5259* (2013.01); *H01L 51/56* (2013.01)

(56) References Cited

U.S. PATENT DOCUMENTS

| | | | | |
|---|---|---|---|---|
| 8,466,476 B2* | 6/2013 | Ma | H01L 51/5259 | 257/88 |
| 8,558,455 B2* | 10/2013 | Kang | H01L 51/5246 | 313/512 |
| 9,601,721 B2* | 3/2017 | Lang | H01L 51/56 | |
| 10,573,846 B2* | 2/2020 | Tang | H01L 51/5246 | |
| 2002/0011799 A1* | 1/2002 | Kimura | G09G 3/3258 | 315/169.3 |
| 2002/0024096 A1* | 2/2002 | Yamazaki | H01L 27/3262 | 257/359 |
| 2003/0091858 A1* | 5/2003 | Peng | H01L 51/5259 | 428/690 |
| 2003/0164681 A1* | 9/2003 | Fukuoka | H01L 51/5246 | 313/512 |
| 2004/0095060 A1* | 5/2004 | Ushifusa | H05B 33/04 | 313/495 |
| 2004/0169174 A1* | 9/2004 | Huh | H01L 51/524 | 257/40 |
| 2004/0263740 A1* | 12/2004 | Sakakura | H05B 33/04 | 349/138 |
| 2005/0040762 A1* | 2/2005 | Kurihara | H01L 51/5259 | 313/512 |
| 2005/0045900 A1* | 3/2005 | Silvernail | H01L 51/5256 | 257/99 |
| 2005/0046345 A1* | 3/2005 | Park | H01L 51/5246 | 313/506 |
| 2005/0052342 A1* | 3/2005 | Wu | H01L 51/5259 | 345/4 |
| 2005/0062174 A1* | 3/2005 | Ingle | H01L 51/0001 | 257/788 |
| 2005/0140291 A1* | 6/2005 | Hirakata | H01L 51/5237 | 313/512 |
| 2005/0224935 A1* | 10/2005 | Schaepkens | H01L 51/5256 | 257/678 |
| 2005/0269926 A1* | 12/2005 | Fukuoka | H01L 51/5259 | 313/123 |
| 2006/0001041 A1* | 1/2006 | Peng | H01L 51/5246 | 257/103 |
| 2007/0013292 A1* | 1/2007 | Inoue | H01L 51/5259 | 313/504 |
| 2007/0043136 A1* | 2/2007 | Cao | C08K 5/3415 | 522/71 |
| 2007/0046178 A1* | 3/2007 | Imai | H01L 27/1222 | 313/504 |
| 2007/0096631 A1* | 5/2007 | Sung | H01J 9/261 | 313/498 |
| 2007/0172971 A1* | 7/2007 | Boroson | H01L 51/5259 | 438/26 |
| 2008/0001533 A1* | 1/2008 | Kim | H01L 51/5246 | 313/504 |
| 2008/0203909 A1* | 8/2008 | Azuma | H01L 51/525 | 313/504 |
| 2009/0001877 A1* | 1/2009 | Park | H01L 51/5259 | 313/504 |
| 2010/0155247 A1* | 6/2010 | Cao | C08L 23/22 | 204/600 |
| 2010/0237453 A1* | 9/2010 | Bonekamp | H01L 51/525 | 257/432 |
| 2011/0114994 A1* | 5/2011 | Mandlik | H01L 51/5203 | 257/100 |
| 2011/0133213 A1* | 6/2011 | Lee | H01L 51/5246 | 257/79 |
| 2011/0242792 A1* | 10/2011 | Choi | H01L 51/5259 | 362/97.1 |
| 2012/0091477 A1* | 4/2012 | Kim | H01L 51/5246 | 257/88 |
| 2012/0112212 A1* | 5/2012 | Kim | H01L 51/5246 | 257/88 |
| 2012/0153333 A1* | 6/2012 | Yamazaki | H01L 51/5259 | 257/98 |
| 2012/0169229 A1* | 7/2012 | You | H01L 51/5253 | 315/51 |
| 2012/0326603 A1* | 12/2012 | Kim | H01L 51/5246 | 313/512 |
| 2013/0056735 A1* | 3/2013 | Heo | H01L 51/5246 | 257/59 |
| 2013/0229108 A1* | 9/2013 | Chen | H01L 51/5256 | 313/511 |
| 2014/0117335 A1* | 5/2014 | Moon | H01L 51/5259 | 257/40 |
| 2014/0160710 A1* | 6/2014 | Yan | G02F 1/133308 | 361/784 |
| 2014/0231767 A1* | 8/2014 | Tsai | H01L 51/5246 | 257/40 |
| 2014/0252325 A1* | 9/2014 | Kim | H01L 51/5259 | 257/40 |
| 2014/0339516 A1* | 11/2014 | Hu | H01L 51/5246 | 257/40 |
| 2015/0023046 A1* | 1/2015 | Shido | F21S 43/145 | 362/543 |
| 2015/0028307 A1* | 1/2015 | Kim | H01L 51/525 | 257/40 |
| 2015/0129855 A1* | 5/2015 | Bando | H01L 51/006 | 257/40 |
| 2015/0270512 A1* | 9/2015 | Yamae | H01L 51/5262 | 257/40 |
| 2015/0303402 A1* | 10/2015 | Yoshikawa | H01L 27/3202 | 257/40 |
| 2016/0035997 A1* | 2/2016 | Oh | H01L 51/5246 | 257/40 |
| 2016/0072099 A1* | 3/2016 | Okamoto | C23C 16/50 | 257/40 |
| 2016/0087243 A1* | 3/2016 | Senoo | H01L 51/5253 | 257/40 |
| 2016/0093645 A1* | 3/2016 | Lee | H01L 27/1225 | 257/43 |
| 2016/0172626 A1* | 6/2016 | Suzuka | H01L 51/5212 | 257/40 |
| 2016/0248042 A1* | 8/2016 | Qian | H01L 51/001 | |
| 2016/0260785 A1* | 9/2016 | Jiao | H01L 51/5259 | |
| 2016/0285048 A1* | 9/2016 | Chung | H01L 27/3293 | |
| 2016/0343977 A1* | 11/2016 | Zeng | H01L 51/5259 | |
| 2017/0012243 A1* | 1/2017 | Suzuki | H01L 51/0024 | |
| 2017/0044053 A1* | 2/2017 | Schuh | B65H 18/00 | |
| 2017/0133624 A1* | 5/2017 | Hong | H01L 51/5259 | |
| 2017/0194597 A1* | 7/2017 | Pang | H01L 23/564 | |
| 2017/0194599 A1* | 7/2017 | Furuie | H01L 51/5246 | |
| 2017/0301739 A1* | 10/2017 | Park | H01L 27/3251 | |
| 2017/0331072 A1* | 11/2017 | Jo | H01L 51/56 | |
| 2018/0182984 A1* | 6/2018 | Lim | H01L 51/5259 | |
| 2018/0197052 A1* | 7/2018 | Yanson | G06K 19/0614 | |
| 2018/0331320 A1* | 11/2018 | Su | H01L 27/3246 | |
| 2019/0123302 A1* | 4/2019 | Luo | B32B 9/045 | |
| 2019/0181376 A1* | 6/2019 | Kim | H01L 27/3246 | |
| 2019/0198804 A1* | 6/2019 | Kodama | H01L 27/3272 | |

FOREIGN PATENT DOCUMENTS

| | | |
|---|---|---|
| CN | 104932166 A | 9/2015 |
| CN | 105633304 A | 6/2016 |

(56) References Cited

FOREIGN PATENT DOCUMENTS

| | | | | |
|---|---|---|---|---|
| CN | 106531898 A | | 3/2017 | |
| CN | 106876328 A | | 6/2017 | |
| CN | 108428804 A | | 8/2018 | |
| CN | 108832024 A | * | 11/2018 | ............ H01L 51/52 |
| DE | 102004049955 A1 | * | 4/2006 | ......... H01L 51/5246 |
| JP | 2000173766 A | * | 6/2000 | ........... H01L 51/525 |
| JP | 2002270366 A | * | 9/2002 | ......... H01L 51/5259 |
| KR | 20090002374 A | | 1/2009 | |
| WO | WO-2006057492 A1 | * | 6/2006 | ......... H01L 51/5246 |
| WO | WO-2015188486 A1 | * | 12/2015 | ......... H01L 51/5259 |

OTHER PUBLICATIONS

Machine translation, Luo, WIPO Pat. Pub. No. WO 2015-188486, translation date: Jun. 22, 2021, Espacenet, all pages. (Year: 2021).*

Machine translation, Yamada, Japanese Pat. Pub. No. JP 2000-173766, translation date: Mar. 17, 2021, Espacenet, all pages. (Year: 2021).*

Machine translation, Yu, Chinese Pat. Pub. No. Cn 108832024A, translation date: Mar. 17, 2021, Espacenet, all pages. (Year: 2021).*

Machine translation, Choi, Korean Pat. Pub. No. KR 10-2009-0002374A, translation date: Feb. 15, 2021, Espacenet, all pages. (Year: 2021).*

Machine translation, Huang, Chinese Pat. Pub. No. CN 104932166A, translation date: Feb. 15, 2021, Espacenet, all pages. (Year: 2021).*

Machine translation, Lang, Chinese Pat. Pub. No. CN 106531898A, translation date: Feb. 15, 2021, Espacenet, all pages. (Year: 2021).*

Machine translation, Wu, Chinese Pat. Pub. No. CN 108428804A, translation date: Feb. 15, 2021, Espacenet, all pages. (Year: 2021).*

Machine translation, Ottermann, German Pat. Pub. No. DE 102004049955, translation date: Jun. 23, 2021, Espacenet, all pages. (Year: 2021).*

* cited by examiner

ORGANIC LIGHT EMITTING DIODE DISPLAY PANEL AND PACKAGING METHOD THEREOF

FIELD OF THE INVENTION

The present invention relates to a display technology field, and more particularly to an organic light emitting diode display panel and a packaging method thereof.

BACKGROUND OF THE INVENTION

The Organic Light Emitting Display (OLED) display, which is also named as Organic electroluminescent display, is a new flat panel display device. Because it possesses many outstanding properties of self-illumination, low driving voltage, high luminescence efficiency, short response time, high clarity and contrast, near 180° view angle, wide range of working temperatures, applicability of flexible display and large scale full color display. The OLED is considered as the most promising display device in the industry.

The OLED display element generally comprises a substrate, an anode located on the substrate, a hole injection layer located on the anode, a hole transporting layer located on the hole injection layer, an emitting layer located on the hole transporting layer, an electron transporting layer located on the emitting layer, an electron injection layer located on the electron transporting layer and a cathode located on the electron injection layer. The principle of the OLED element is that the illumination generates due to the carrier injection and recombination under the electric field driving of the semiconductor material and the organic semiconductor illuminating material. Specifically, the (Indium Tin Oxide) ITO pixel electrode and the metal electrode are respectively employed as the anode and the cathode of the OLED element. Under certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

In the conventional OLED display panel, an OLED element is generally packaged by arranging a package cover plate over the OLED element. A circle of sealant is placed on the package cover plate corresponding to the package area of the substrate. The outermost layer of the substrate located in the package area is a passivation layer, and the sealant is adhered to the passivation layer so as to realize the package of the OLED. Since the silicon oxide is generally used as a passivation layer in the prior art, the bonding effect of silicon oxide and the sealant is poor, and water vapor easily enters the OLED element, resulting in a lower performance of the OLED element and a poor reliability performance.

SUMMARY OF THE INVENTION

An objective of the present invention is to provide an organic light emitting diode display panel, of which a performance of an organic light emitting diode element is great, and the organic light emitting diode element possesses a long service life and a good reliability performance.

Another objective of the present invention is to provide a packaging method of an organic light emitting diode display panel, which will not reduce the performance of the organic light emitting diode element to improve a service life of organic light emitting diode element and to possess a good reliability performance.

For realizing the aforesaid objectives, the present invention provides an organic light emitting diode display panel, comprising: a substrate, a passivation layer disposed on the substrate, an organic light emitting diode element disposed on the passivation layer, an adhesive layer disposed on the passivation layer and located at a periphery of the organic light emitting diode element, a cover plate disposed on the organic light emitting diode element and a sealant, which is disposed between the cover plate and the passivation layer and corresponds to the adhesive layer.

A material of the passivation layer is silicon oxide.

A material of the adhesive layer is epoxy resin doped with titanium dioxide, calcium oxide and silicon oxide.

The substrate comprises a display area and a packaging area surrounding the display area; the organic light emitting diode element is located in the display area, and the adhesive layer is located in the packaging area.

The passivation layer is provided with a groove corresponding to the periphery of the organic light emitting diode element, and the adhesive layer is located in the groove.

The present invention further provides a packaging method of an organic light emitting diode display panel, comprising:

Step S1, providing a substrate, and forming a passivation layer on the substrate, and forming an organic light emitting diode element on the passivation layer;

Step S2, forming a circle of adhesive layer on the passivation layer corresponding to a periphery of the organic light emitting diode element;

Step S3, providing a cover plate, and coating a circle of sealant to a position on the cover plate corresponding to the adhesive layer;

Step S4, assembling the cover plate and the substrate so that the sealant is in contact with the adhesive layer to bond the substrate and the cover plate.

A material of the passivation layer is silicon oxide.

A material of the adhesive layer is epoxy resin doped with titanium dioxide, calcium oxide and silicon oxide.

The substrate comprises a display area and a packaging area surrounding the display area; the organic light emitting diode element is located in the display area, and the adhesive layer is located in the packaging area.

Step S1 further comprises: forming a groove on the passivation layer corresponding to the periphery of the organic light emitting diode element; the adhesive layer in Step S2 is formed in the groove.

The benefits of the present invention are: the organic light emitting diode display panel of the present invention is provided with an adhesive layer on a passivation layer corresponding to a position of a sealant. As packaging the organic light emitting diode, the sealant on a cover plate is adhered corresponding to a position of the adhesive layer. The adhesive layer has a good bonding force with the sealant and also has a good bonding force with the passivation layer. Thus, water vapor does not easily enter the organic light emitting diode element, which will not reduce the performance of the organic light emitting diode element to improve a service life of organic light emitting diode element and to possess a good reliability performance. The packaging method of an organic light emitting diode display panel can make water vapor not easily enter the organic light emitting diode element, which will not reduce the performance of the organic light emitting diode element to improve a service life of organic light emitting diode element and to possess a good reliability performance.

BRIEF DESCRIPTION OF THE DRAWINGS

In order to better understand the characteristics and technical aspect of the invention, please refer to the following detailed description and accompanying drawings of the present invention. However, the drawings are provided for reference only and are not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
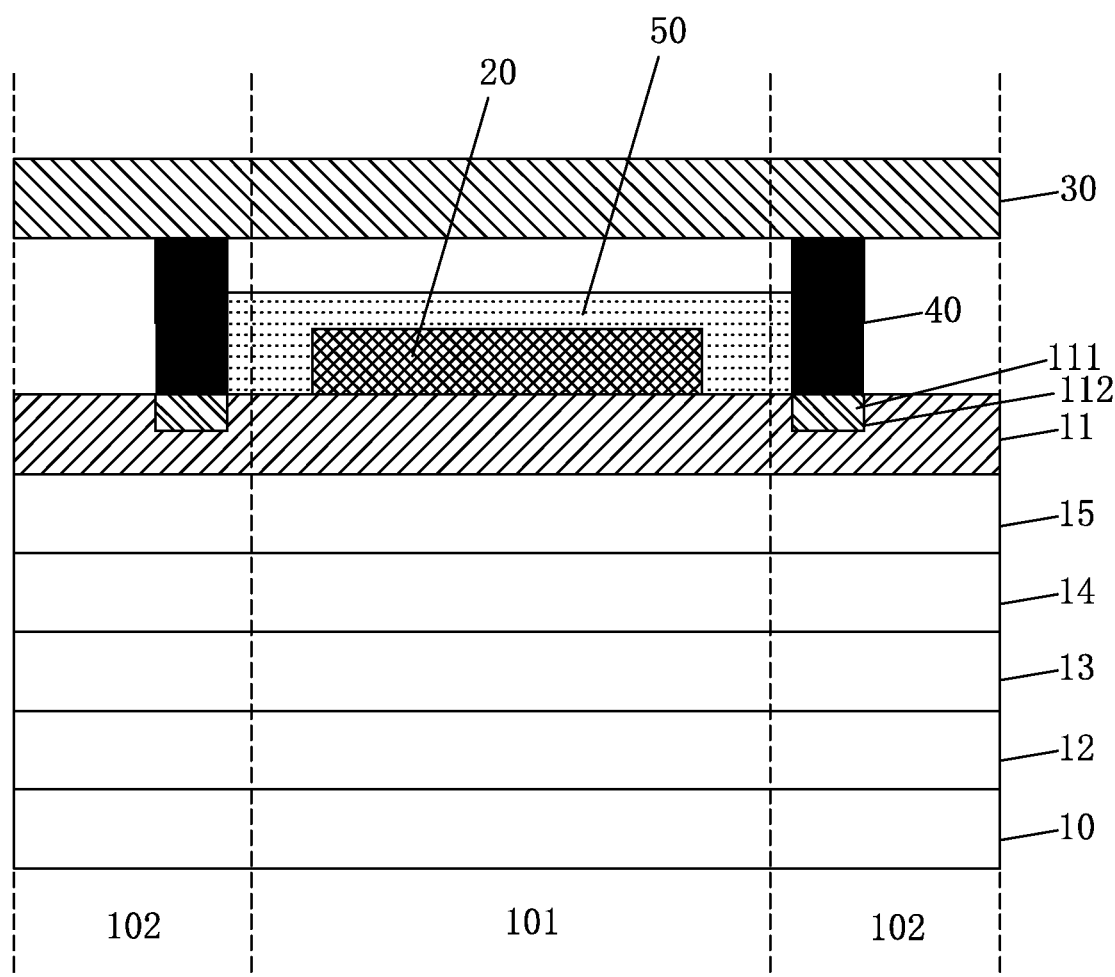
FIG. 1 is a structural diagram of an organic light emitting diode display panel of the present invention.
Figure 2:
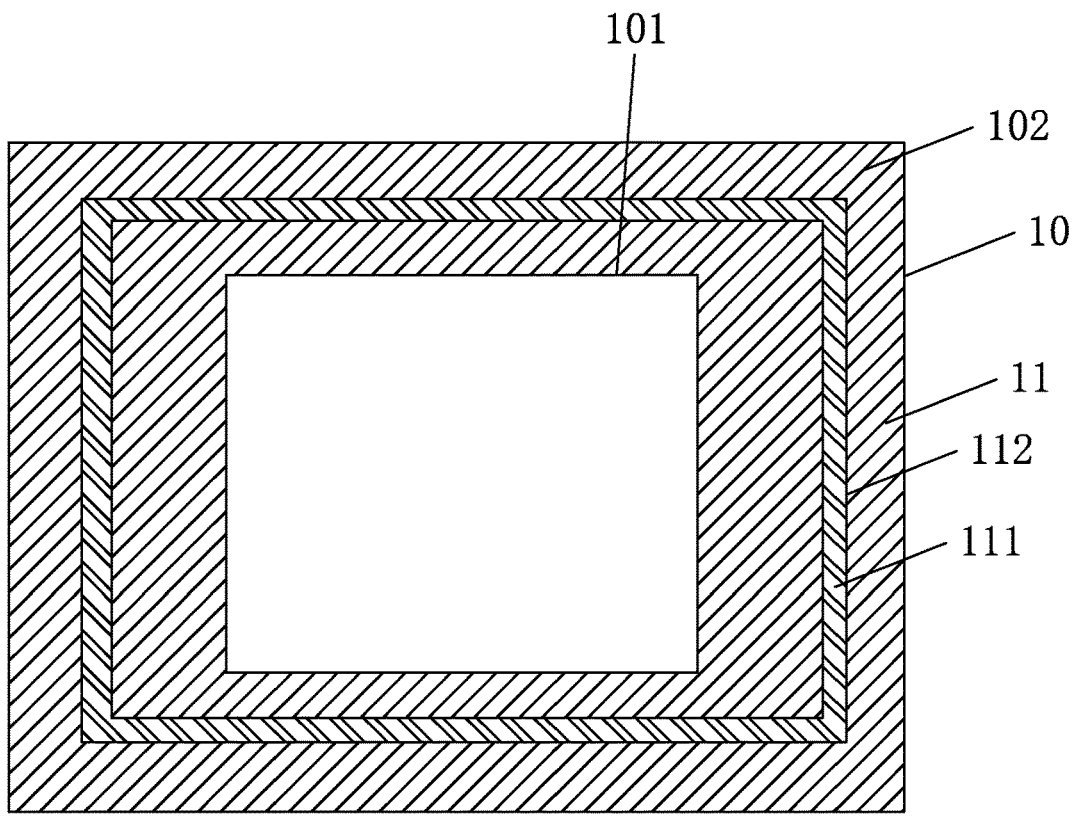
FIG. 2 is a top view diagram of a substrate of an organic light emitting diode display panel of the present invention.
Figure 3:
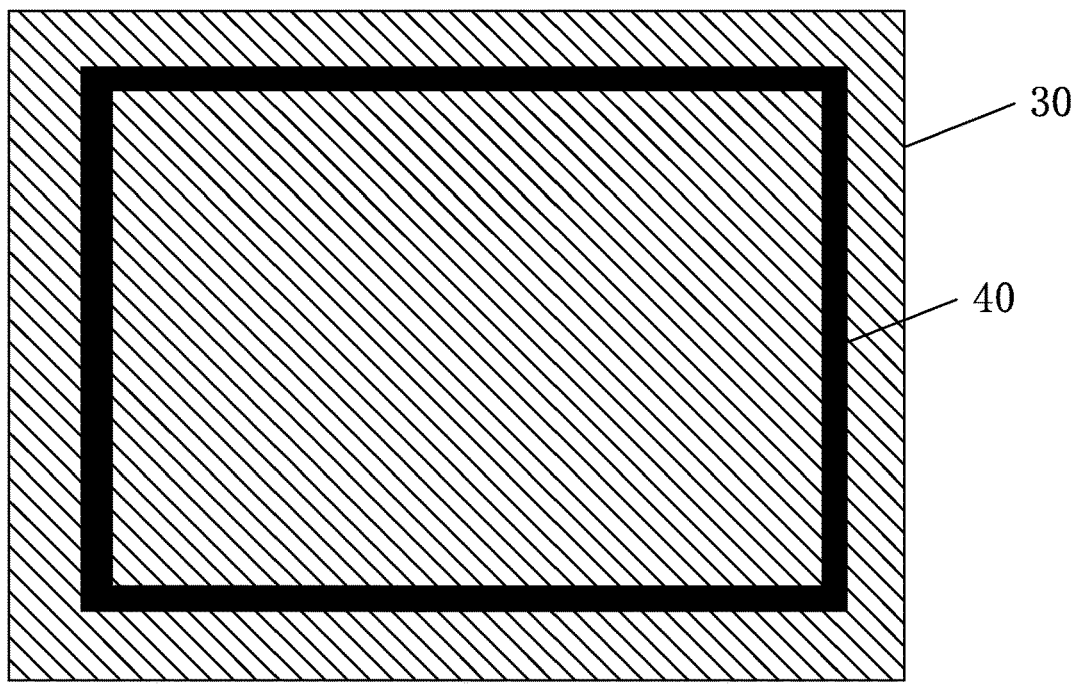
FIG. 3 is a top view diagram of a cover plate of an organic light emitting diode display panel of the present invention.

Seeing FIG. 1 to FIG. 3, an organic light emitting diode display panel comprises: a substrate 10, a passivation layer 11 disposed on the substrate 10, an organic light emitting diode element 20 disposed on the passivation layer 11, an adhesive layer 111 disposed on the passivation layer 11 and located at a periphery of the organic light emitting diode element 20, a cover plate 30 disposed on the organic light emitting diode element 20 and a sealant 40, which is disposed between the cover plate 30 and the passivation layer 11 and corresponds to the adhesive layer 111.

Specifically, the adhesive layer 111 is provided on a passivation layer 11 corresponding to a position of the sealant 40. As packaging the organic light emitting diode, the sealant 40 on the cover plate 30 is adhered corresponding to a position of the adhesive layer 111. The adhesive layer 111 has a good bonding force with the sealant 40 and also has a good bonding force with the passivation layer 11. Thus, water vapor does not easily enter the organic light emitting diode element 20, which will not reduce the performance of the organic light emitting diode element 20 to improve a service life of organic light emitting diode element 20 and to possess a good reliability performance.

A material of the passivation layer 11 is silicon oxide.

Specifically, a material of the adhesive layer 111 is epoxy resin doped with titanium dioxide, calcium oxide and silicon oxide, so that the adhesive layer 111 possesses good mechanical properties, and good heat and high temperature resistances.

Specifically, the adhesive layer 111 is formed on the passivation layer 11 by high-temperature printing or high-temperature transfer.

Specifically, the substrate 10 comprises a display area 101 and a packaging area 102 surrounding the display area 101; the organic light emitting diode element 20 is located in the display area 101, and the adhesive layer 111 is located in the packaging area 102.

Specifically, the passivation layer 11 is provided with a groove 112 corresponding to the periphery of the organic light emitting diode element 20, and the adhesion layer 111 is located in the groove 112 for further increasing the bonding force of the adhesive layer 111 and the passivation layer 11. Preferably, the thickness of the adhesive layer 111 is equal to the depth of the groove 112. Then, the upper surface of the adhesive layer 111 is leveled with the upper surface of the passivation layer 11, so that the adhesive layer 111 does not increase the overall thickness of the organic light emitting diode display panel.

Specifically, the organic light emitting diode display panel further comprises a gate metal layer 12, a gate insulating layer 13, an etching stopper layer 14 and a source-drain metal layer 15, which are sequentially disposed on the substrate 10 and between the substrate 10 and the passivation layer 11. The organic light emitting diode element 20 is in contact with the source-drain metal layer 15 through a via (not shown) penetrating through the passivation layer 11.

Furthermore, the organic light emitting diode display panel further comprises a thin film packaging layer 50, which is disposed on the substrate 11 and covers the organic light emitting diode element 20 for further preventing water vapor from entering the organic light emitting diode element 20, and for improving the service life of the organic light emitting diode element 20. The thin film packaging layer 50 may have a structure, in which an inorganic material layer and an organic material layer are stacked on each other, and it is preferable that three layers of an inorganic material layer, an organic material layer and an inorganic material layer are stacked on in order.

Specifically, the inorganic material layer is made of silicon oxide, silicon nitride, or silicon oxynitride; the organic material layer may be made of epoxy resin, silicon-based polymer or polymethyl methacrylate. Specifically, a material of the substrate 10 and the cover plate 30 is glass or a flexible substrate.

Figure 4:
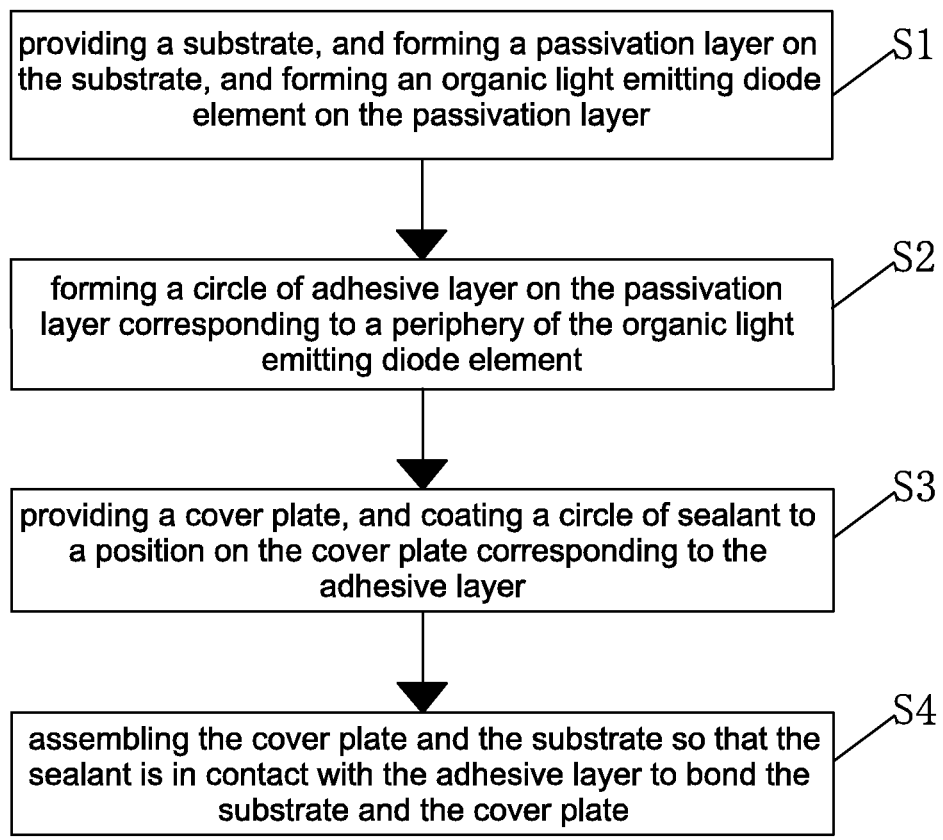
FIG. 4 is a flowchart of a packaging method of an organic light emitting diode display panel of the present invention.

Please refer to FIG. 4. On the basis of the aforesaid organic light emitting diode display panel, the present invention further provides a packaging method of an organic light emitting diode display panel, comprising:

Step S1, providing a substrate 10, and forming a passivation layer 11 on the substrate 10, and forming an organic light emitting diode element 20 on the passivation layer 11;

Step S2, forming a circle of adhesive layer 111 on the passivation layer 11 corresponding to a periphery of the organic light emitting diode element 20;

Step S3, providing a cover plate 30, and coating a circle of sealant 40 to a position on the cover plate 30 corresponding to the adhesive layer 111;

Step S4, assembling the cover plate 30 and the substrate 10 so that the sealant 40 is in contact with the adhesive layer 111 to bond the substrate 10 and the cover plate 30.

Specifically, the adhesive layer 111 is provided on a passivation layer 11 corresponding to a position of the sealant 40. As packaging the organic light emitting diode, the sealant 40 on the cover plate 30 is adhered corresponding to a position of the adhesive layer 111. The adhesive layer 111 has a good bonding force with the sealant 40 and also has a good bonding force with the passivation layer 11. Thus, water vapor does not easily enter the organic light emitting diode element 20, which will not reduce the performance of the organic light emitting diode element 20 to improve a service life of organic light emitting diode element 20 and to possess a good reliability performance.

A material of the passivation layer 11 is silicon oxide.

Specifically, a material of the adhesive layer 111 is epoxy resin doped with titanium dioxide, calcium oxide and silicon oxide, so that the adhesive layer 111 possesses good mechanical properties, and good heat and high temperature resistances.

Specifically, in Step S2, the adhesive layer 111 is formed on the passivation layer 11 by high-temperature printing or high-temperature transfer.

Specifically, the substrate 10 comprises a display area 101 and a packaging area 102 surrounding the display area 101; the organic light emitting diode element 20 is located in the display area 101, and the adhesive layer 111 is located in the packaging area 102.

Specifically, Step S2 further comprises: forming a groove 112 on the passivation layer 11 corresponding to the periphery of the organic light emitting diode element 20, so that the adhesive layer 111 in Step S2 is formed in the groove 112 for further increasing the bonding force of the adhesive layer 111 and the passivation layer 11. Preferably, the thickness of the adhesive layer 111 is equal to the depth of the groove 112. Then, the upper surface of the adhesive layer 111 is leveled with the upper surface of the passivation layer 11, so that the adhesive layer 111 does not increase the overall thickness of the organic light emitting diode display panel.

Specifically, Step S1 further comprises: fabricating a gate metal layer 12, a gate insulating layer 13, an etching stopper layer 14 and a source-drain metal layer 15, which are sequentially disposed on the substrate 10 and between the substrate 10 and the passivation layer 11, wherein the organic light emitting diode element 20 is in contact with the source-drain metal layer 15 through a via (not shown) penetrating through the passivation layer 11.

Furthermore, Step S1 further comprises: fabricating a thin film packaging layer 50, which is on the substrate 11 and covers the organic light emitting diode element 20 for further preventing water vapor from entering the organic light emitting diode element 20, and for improving the service life of the organic light emitting diode element 20. The thin film packaging layer 50 may have a structure, in which an inorganic material layer and an organic material layer are stacked on each other, and it is preferable that three layers of an inorganic material layer, an organic material layer and an inorganic material layer are stacked on in order.

Specifically, the inorganic material layer is made of silicon oxide, silicon nitride, or silicon oxynitride; the organic material layer may be made of epoxy resin, silicon-based polymer or polymethyl methacrylate.

Specifically, a material of the substrate 10 and the cover plate 30 is glass or a flexible substrate.

In conclusion, the organic light emitting diode display panel of the present invention is provided with an adhesive layer on a passivation layer corresponding to a position of a sealant. When packaging the organic light emitting diode, the sealant on a cover plate is adhered corresponding to a position of the adhesive layer. The adhesive layer has a good bonding force with the sealant and also has a good bonding force with the passivation layer. Thus, water vapor does not easily enter the organic light emitting diode element, which will not reduce the performance of the organic light emitting diode element to improve a service life of organic light emitting diode element and to possess a good reliability performance. The packaging method of an organic light emitting diode display panel can make water vapor not easily enter the organic light emitting diode element, which will not reduce the performance of the organic light emitting diode element to improve a service life of organic light emitting diode element and to possess a good reliability performance.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode display panel, comprising: a substrate, a passivation layer disposed on the substrate, an organic light emitting diode element disposed on the passivation layer, an adhesive layer disposed on the passivation layer and located at a periphery of the organic light emitting diode element, a cover plate disposed on the organic light emitting diode element and a sealant, which is disposed between the cover plate and the passivation layer and corresponds to the adhesive layer, wherein the passivation layer is provided with a groove corresponding to the periphery of the organic light emitting diode element, and the adhesive layer is located in the groove to bond the passivation layer and the sealant.

2. The organic light emitting diode display panel according to claim 1, wherein a material of the passivation layer is silicon oxide.

3. The organic light emitting diode display panel according to claim 1, wherein a material of the adhesive layer is epoxy resin doped with titanium dioxide, calcium oxide and silicon oxide.

4. The organic light emitting diode display panel according to claim 1, wherein the substrate comprises a display area and a packaging area surrounding the display area; the organic light emitting diode element is located in the display area, and the adhesive layer is located in the packaging area.

5. A packaging method of an organic light emitting diode display panel, comprising:
   Step S1, providing a substrate, and forming a passivation layer on the substrate, and forming an organic light emitting diode element on the passivation layer, and forming a groove on the passivation layer corresponding to a periphery of the organic light emitting diode element;
   Step S2, forming a circle of adhesive layer in the groove of the passivation layer corresponding to the periphery of the organic light emitting diode element;
   Step S3, providing a cover plate, and coating a circle of sealant to a position on the cover plate corresponding to the adhesive layer;
   Step S4, assembling the cover plate and the substrate so that the sealant is in contact with the adhesive layer to bond the substrate and the cover plate with bonding the passivation layer and the sealant by the adhesive layer.

6. The packaging method of the organic light emitting diode display panel according to claim 5, wherein a material of the passivation layer is silicon oxide.

7. The packaging method of the organic light emitting diode display panel according to claim 5, wherein a material of the adhesive layer is epoxy resin doped with titanium dioxide, calcium oxide and silicon oxide.

8. The packaging method of the organic light emitting diode display panel according to claim 5, wherein the substrate comprises a display area and a packaging area surrounding the display area; the organic light emitting diode element is located in the display area, and the adhesive layer is located in the packaging area.

* * * * *